(12) United States Patent
Dewey et al.

(10) Patent No.: US 10,636,912 B2
(45) Date of Patent: Apr. 28, 2020

(54) FINFET TRANSISTOR HAVING A TAPERED SUBFIN STRUCTURE

(71) Applicant: Intel Corporation, Santa Clara, CA (US)

(72) Inventors: Gilbert Dewey, Hillsboro, OR (US); Willy Rachmady, Beaverton, OR (US); Matthew V. Metz, Portland, OR (US); Jack T. Kavalieros, Portland, OR (US); Chandra S. Mohapatra, Beaverton, OR (US); Sean T. Ma, Portland, OR (US); Tahir Ghani, Portland, OR (US); Anand S. Murthy, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/309,049

(22) PCT Filed: Jun. 30, 2016

(86) PCT No.: PCT/US2016/040564
§ 371 (c)(1),
(2) Date: Dec. 11, 2018

(87) PCT Pub. No.: WO2018/004632
PCT Pub. Date: Jan. 4, 2018

(65) Prior Publication Data
US 2019/0341481 A1    Nov. 7, 2019

(51) Int. Cl.
*H01L 29/78* (2006.01)
*H01L 21/02* (2006.01)
*H01L 29/66* (2006.01)

(52) U.S. Cl.
CPC ...... *H01L 29/785* (2013.01); *H01L 21/02532* (2013.01); *H01L 21/02543* (2013.01); *H01L 21/02546* (2013.01); *H01L 21/02549* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 9,564,494 B1* | 2/2017 | Cheng | H01L 29/32 |
| 2006/0282707 A1* | 12/2006 | Rosenbluth | G06F 11/3648 |
| | | | 714/38.14 |
| 2008/0099785 A1 | 5/2008 | Bai et al. | |

(Continued)

OTHER PUBLICATIONS

International Preliminary Report on Patentability for International Application No. PCT/US2016/040564 dated Jan. 10, 2019, 12 pgs.

(Continued)

*Primary Examiner* — J. E. Schoenholtz
(74) *Attorney, Agent, or Firm* — Schwabe, Williamson & Wyatt P.C.

(57) ABSTRACT

An apparatus is described. The apparatus includes a FINFET transistor. The FINFET transistor comprises a tapered subfin structure having a sidewall surface area that is large enough to induce aspect ratio trapping of lattice defects along sidewalls of the subfin structure so that the defects are substantially prevented from reaching said FINFET transistor's channel.

23 Claims, 16 Drawing Sheets

X = surface lattice defect

(56) References Cited

U.S. PATENT DOCUMENTS

| | | |
|---|---|---|
| 2011/0210374 A1 | 9/2011 | Lochtefeld |
| 2013/0043506 A1 | 2/2013 | Tsai et al. |
| 2016/0049511 A1 | 2/2016 | Kim et al. |
| 2016/0181247 A1 | 6/2016 | Anderson et al. |
| 2017/0140919 A1* | 5/2017 | Cheng .................... H01L 29/32 |
| 2017/0373064 A1* | 12/2017 | Chang ............. H01L 21/823821 |

OTHER PUBLICATIONS

International Search Report and Written Opinion for International Patent Application No. PCT/US2016/040564 dated Mar. 31, 2017, 15 pgs.

\* cited by examiner

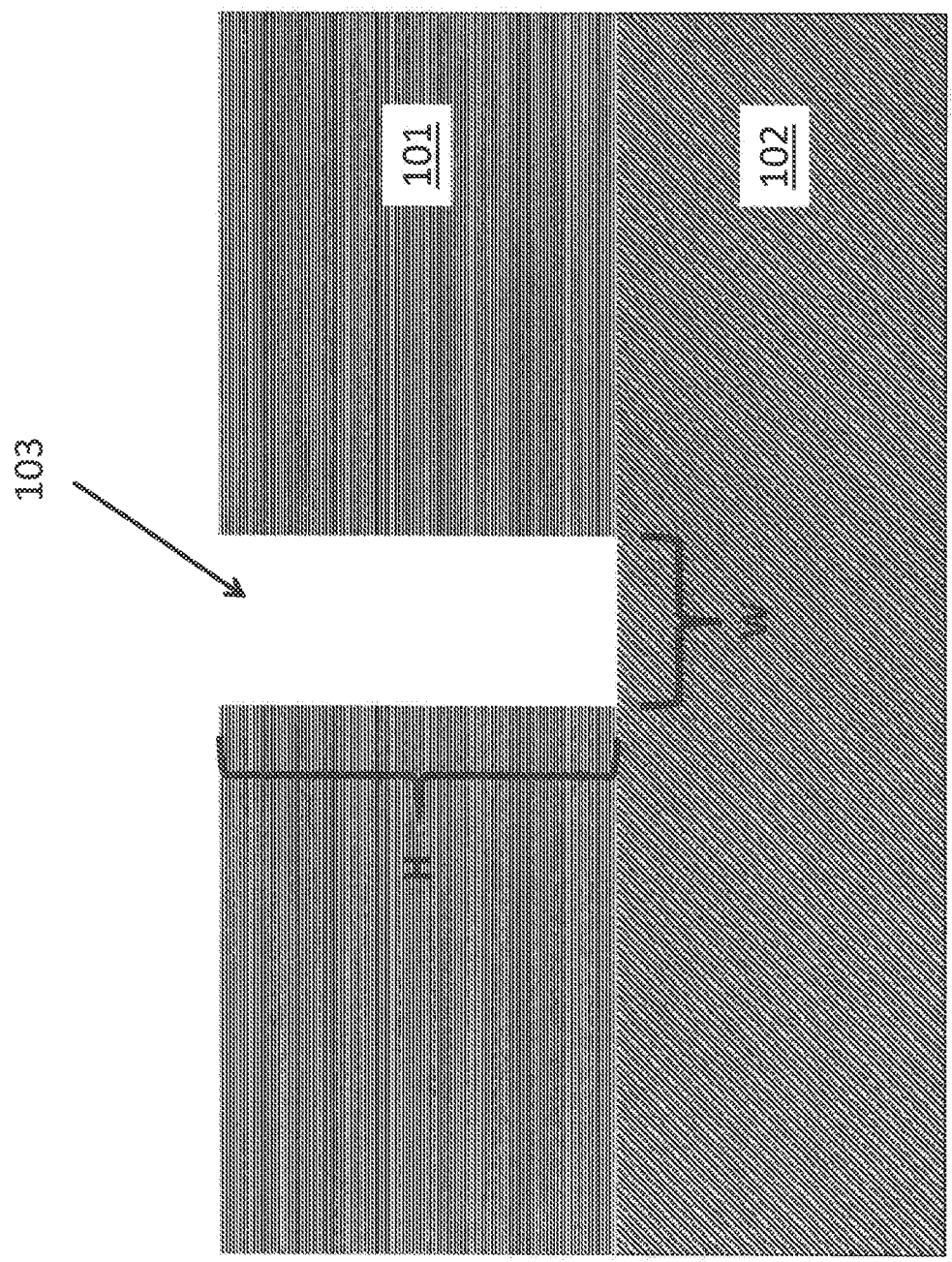

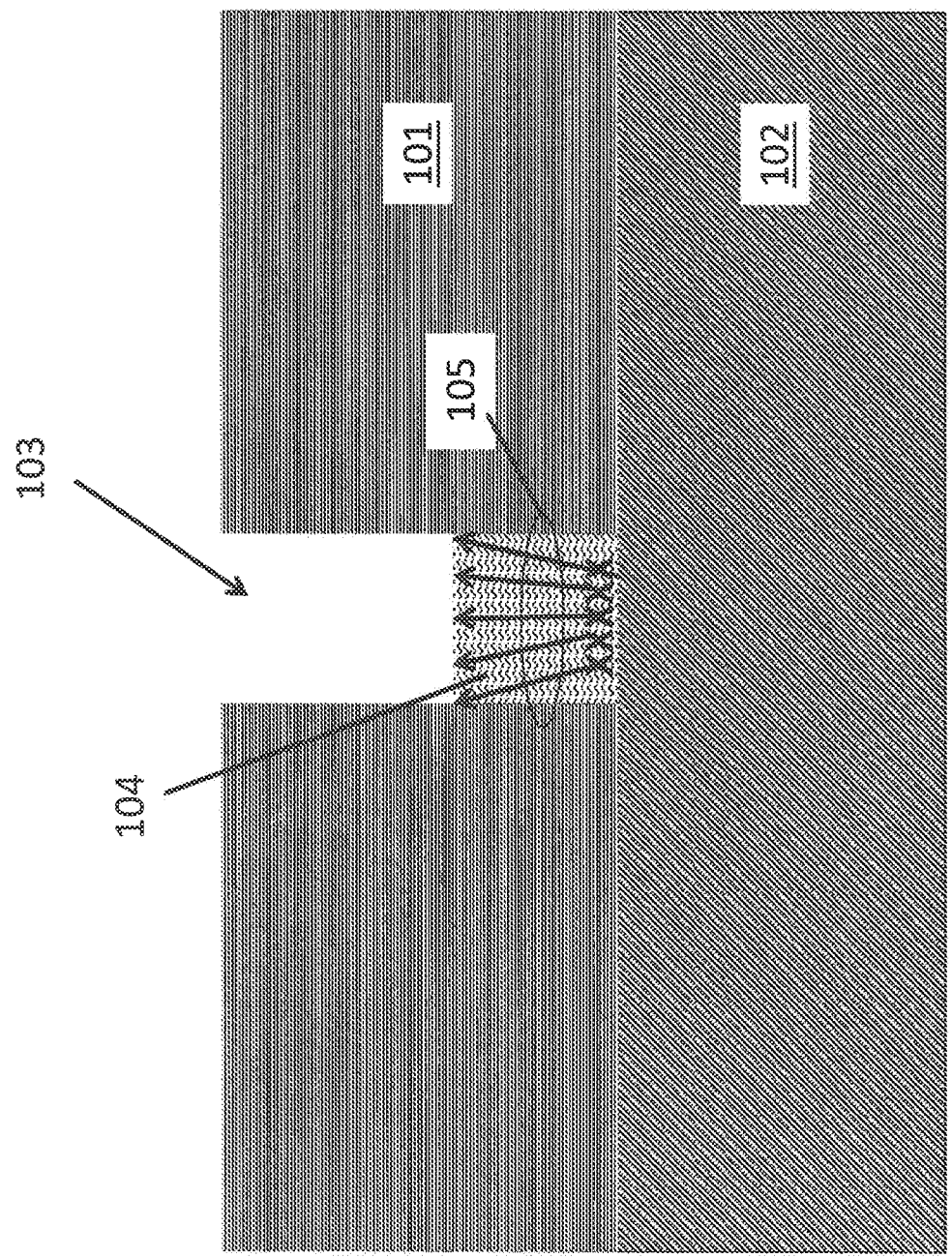

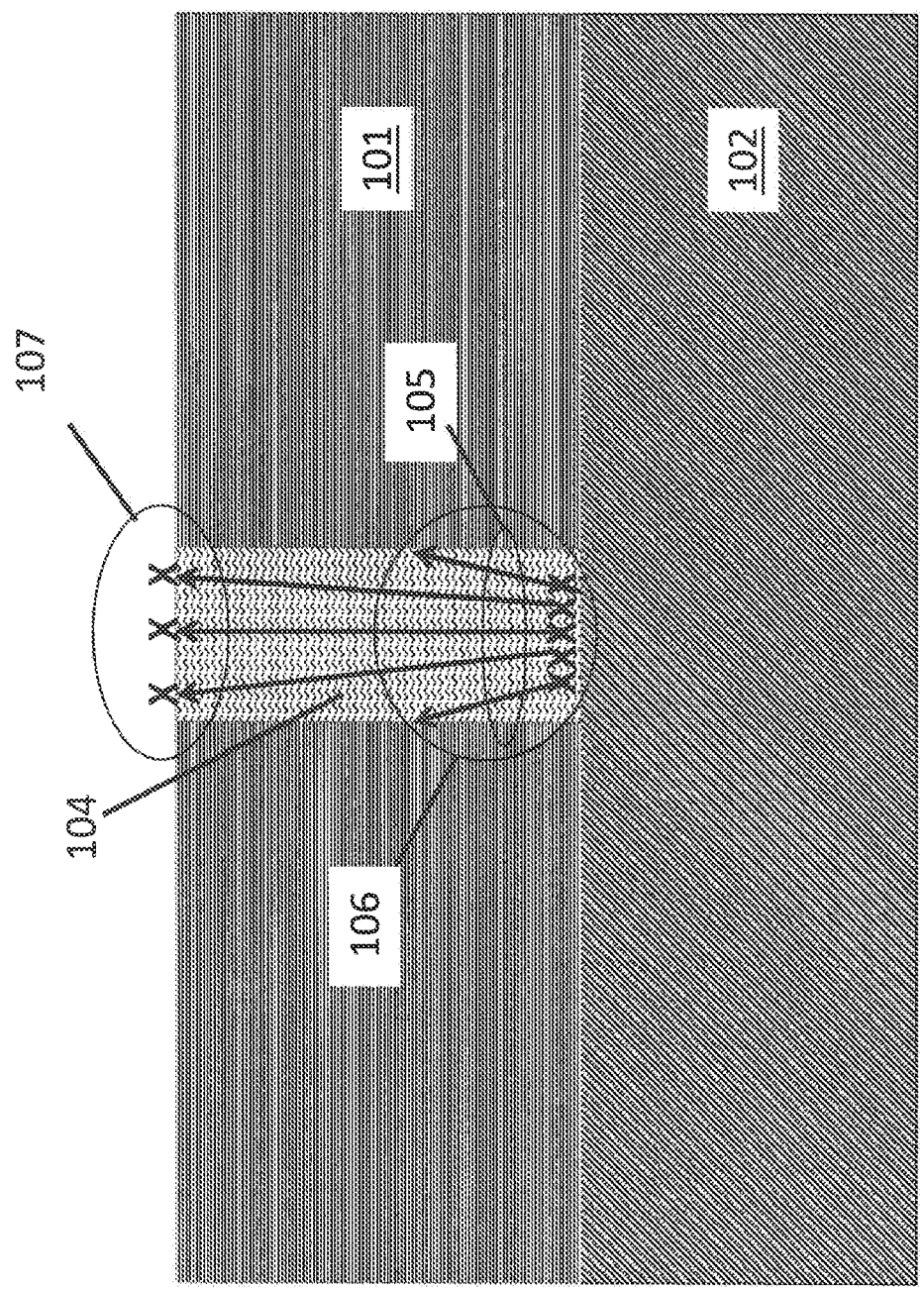

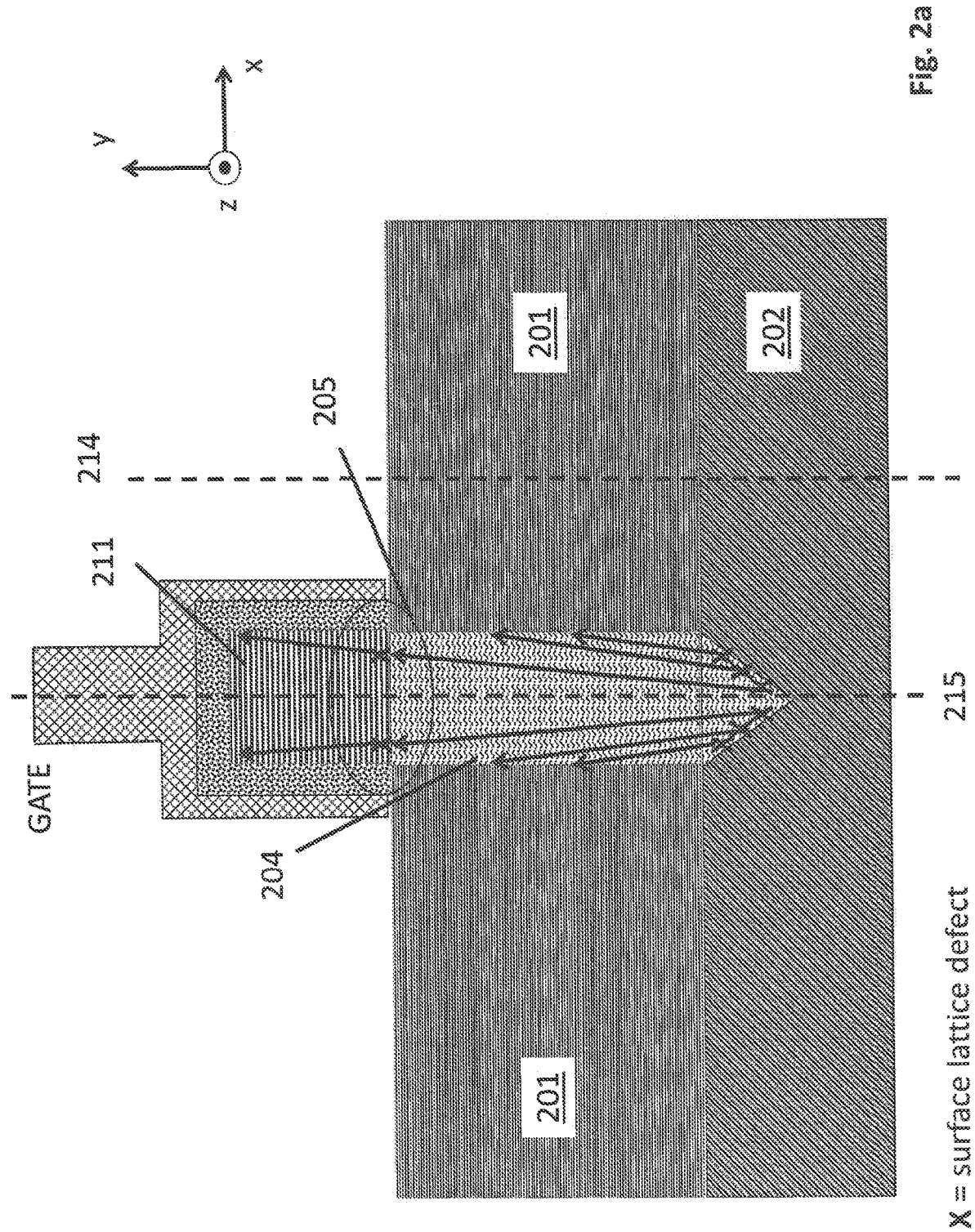

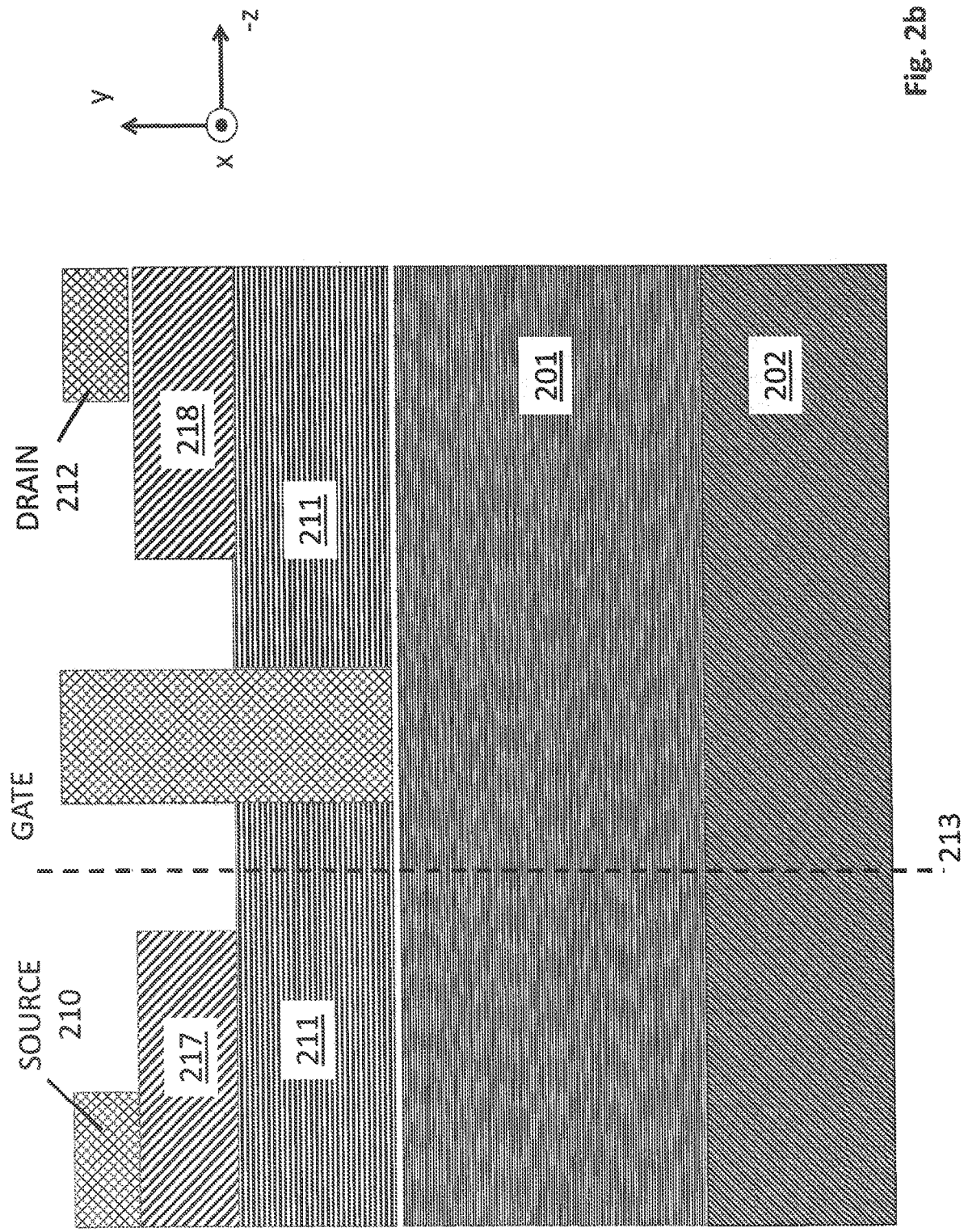

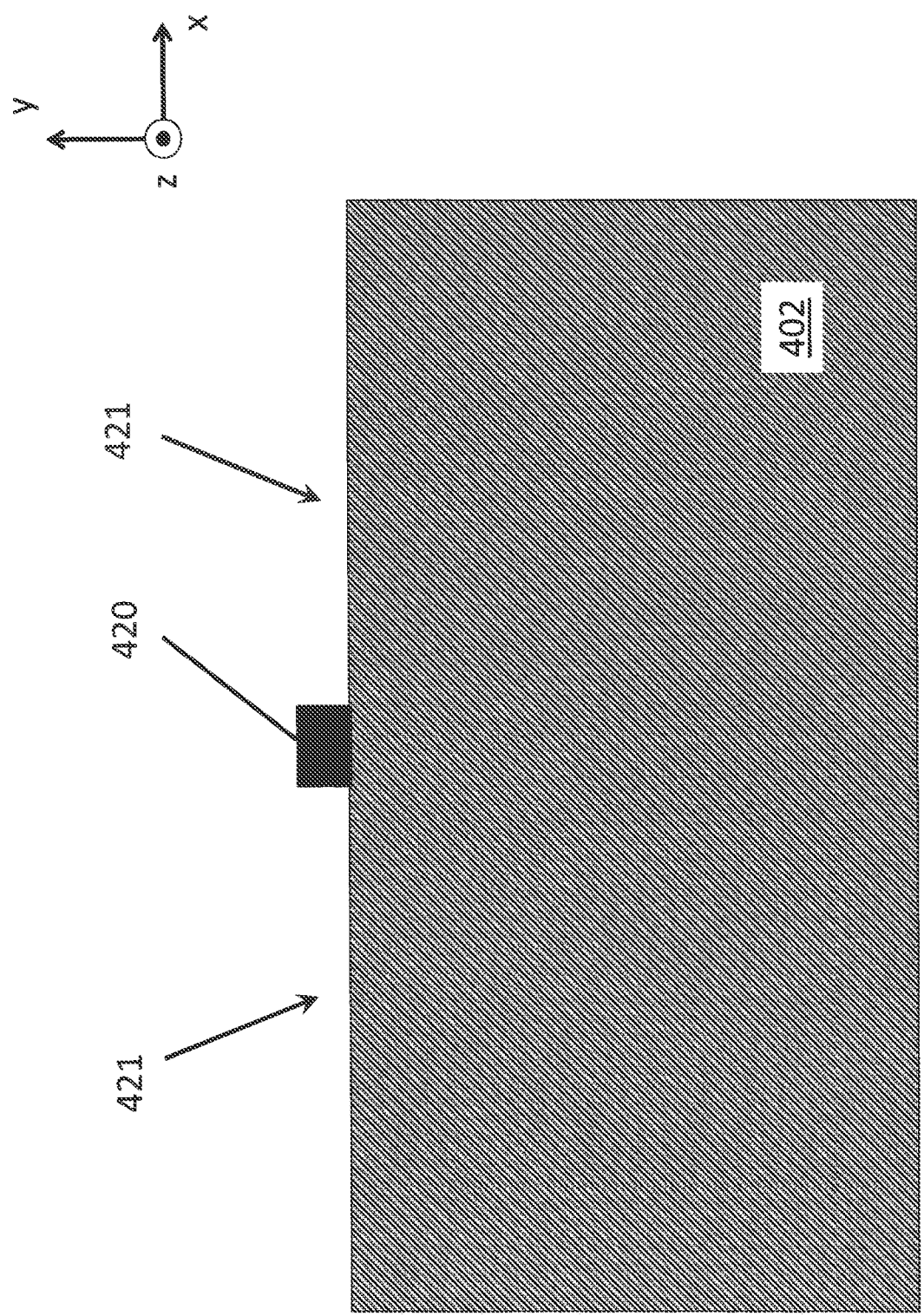

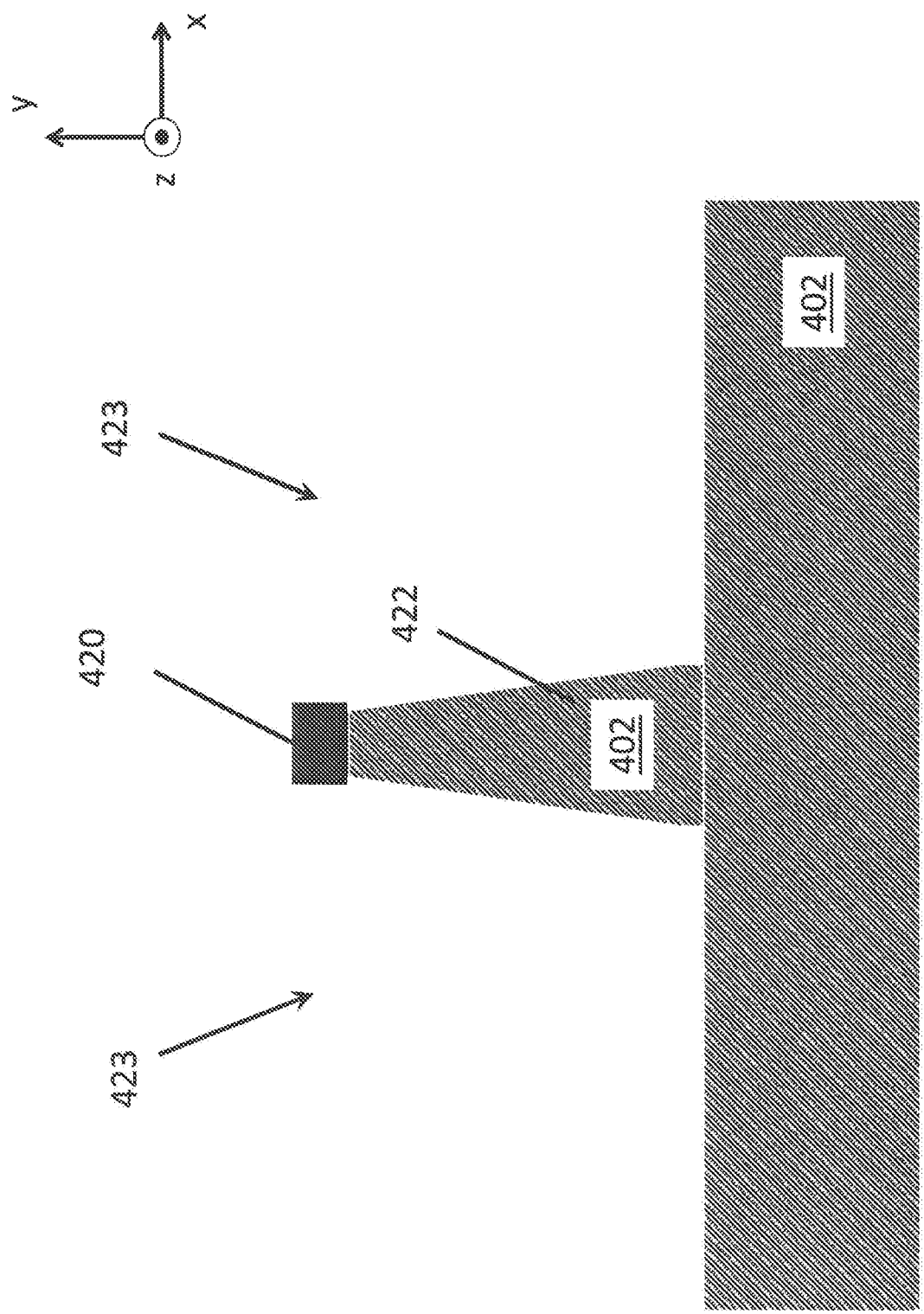

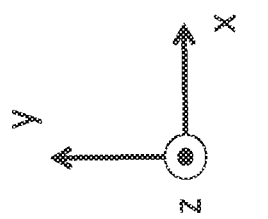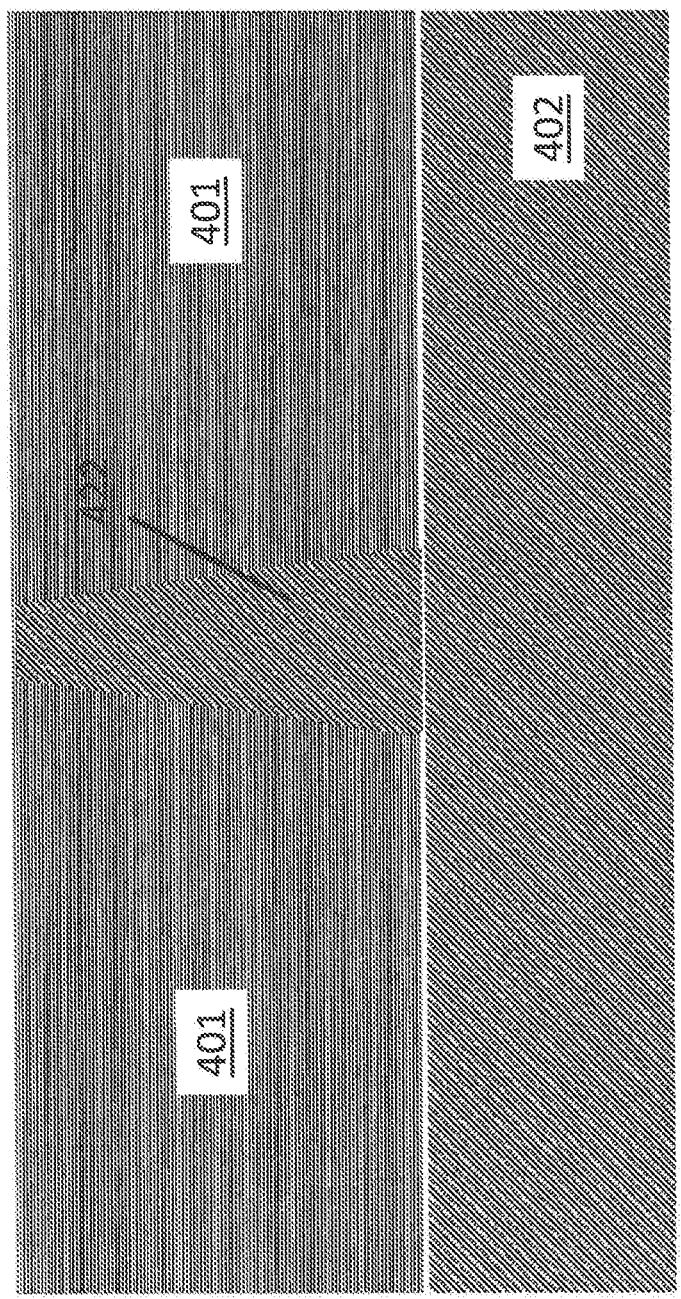
Fig. 4c

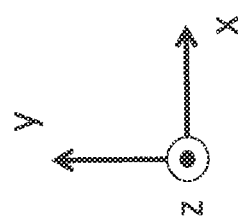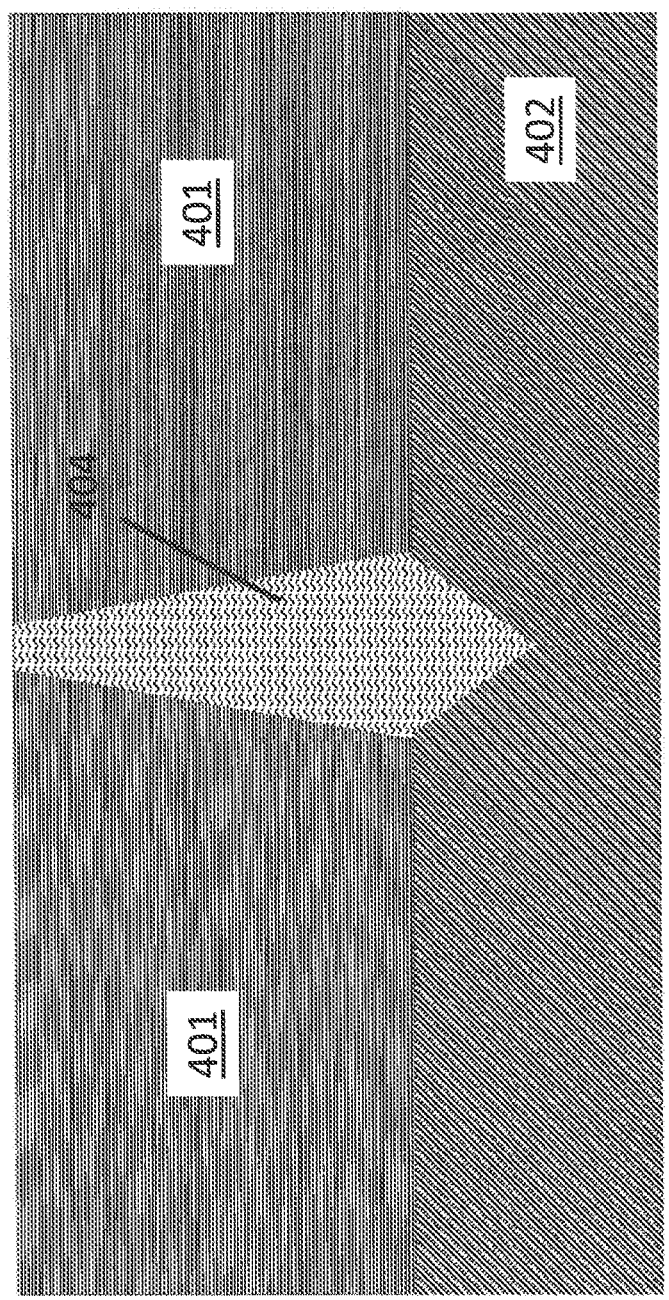
Fig. 4f

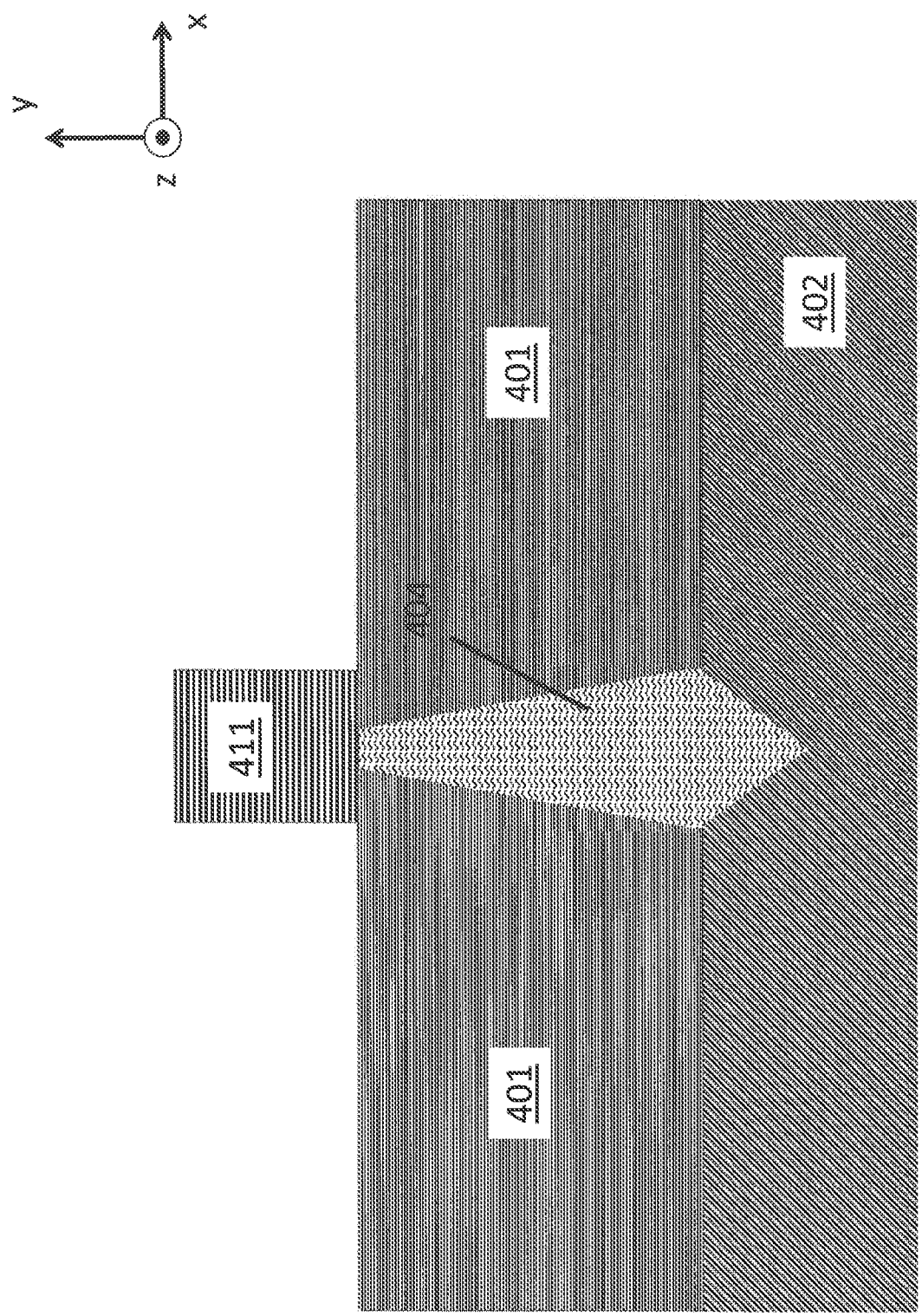

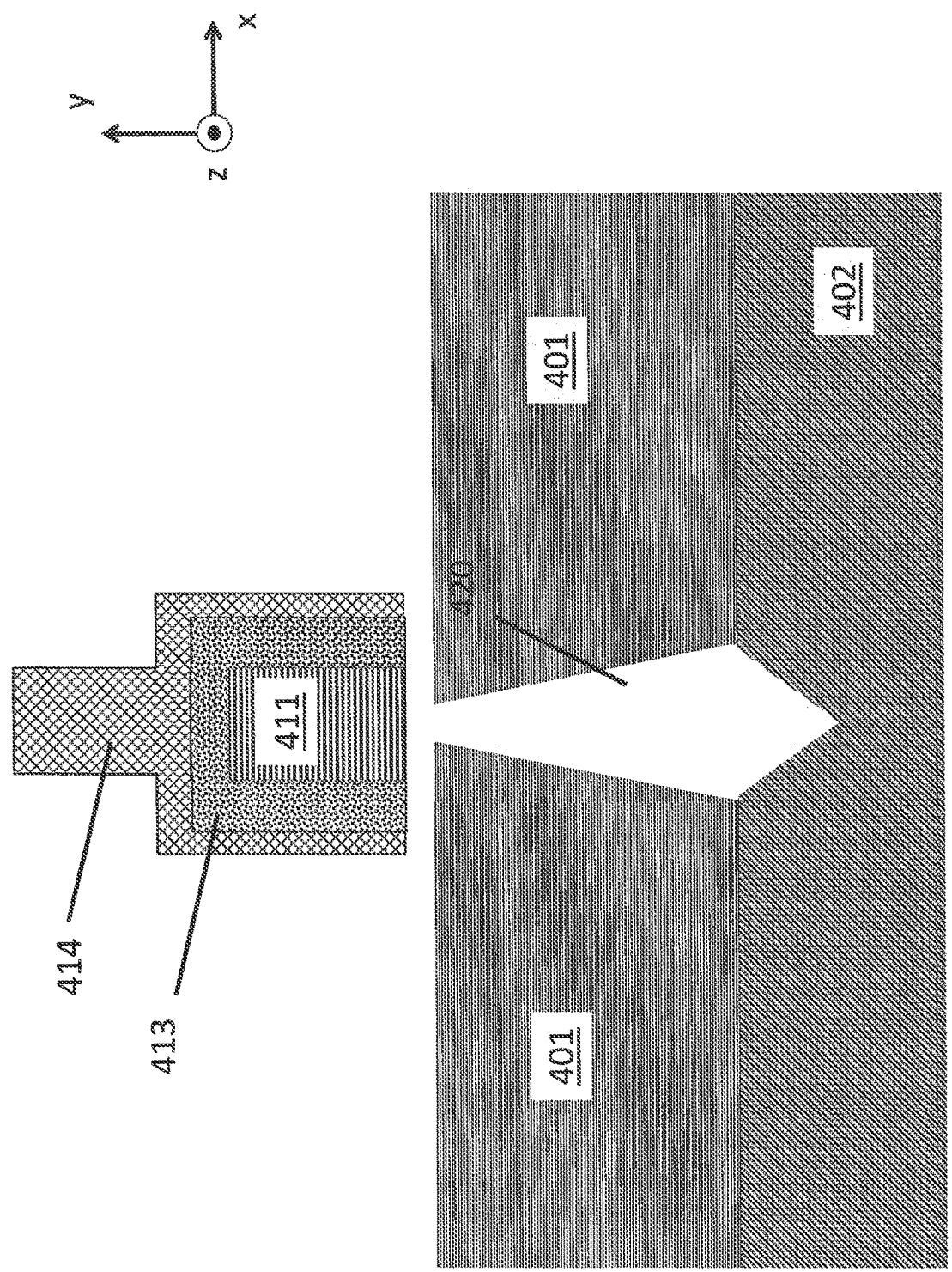

FINFET TRANSISTOR HAVING A TAPERED SUBFIN STRUCTURE

CROSS-REFERENCE TO RELATED APPLICATION

This patent application is a U.S. National Phase Application under 35 U.S.C. § 371 of International Application No. PCT/US2016/040564, filed Jun. 30, 2016, entitled "A FINFET TRANSISTOR HAVING A TAPERED SUBFIN STRUCTURE," which designates the United States of America, the entire disclosure of which is hereby incorporated by reference in its entirety and for all purposes.

FIELD OF INVENTION

The field of invention is directed to the semiconductor arts, generally, and, more specifically, to a FINFET transistor having a tapered subfin structure.

BACKGROUND

Semiconductor manufacturing engineers are continually seeking ways to increase the speed of the transistors they manufacture, while, at the same time, reduce the complexities of the underlying manufacturing processes used to manufacture their devices. The former enhances the performance of the device as realized by a customer/user of the device. The later reduces the cost of manufacturing the device.

FIGURES

A better understanding of the present invention can be obtained from the following detailed description in conjunction with the following drawings, in which:

FIGS. 1a, 1b and 1c (prior art) demonstrate aspect ratio trapping;

FIGS. 2a, 2b and 2c (prior art) show different perspectives of a FINFET device;

FIGS. 4a through 4h show a method of manufacturing the FINFET device of FIG. 3;

DETAILED DESCRIPTION

Figure 2C:
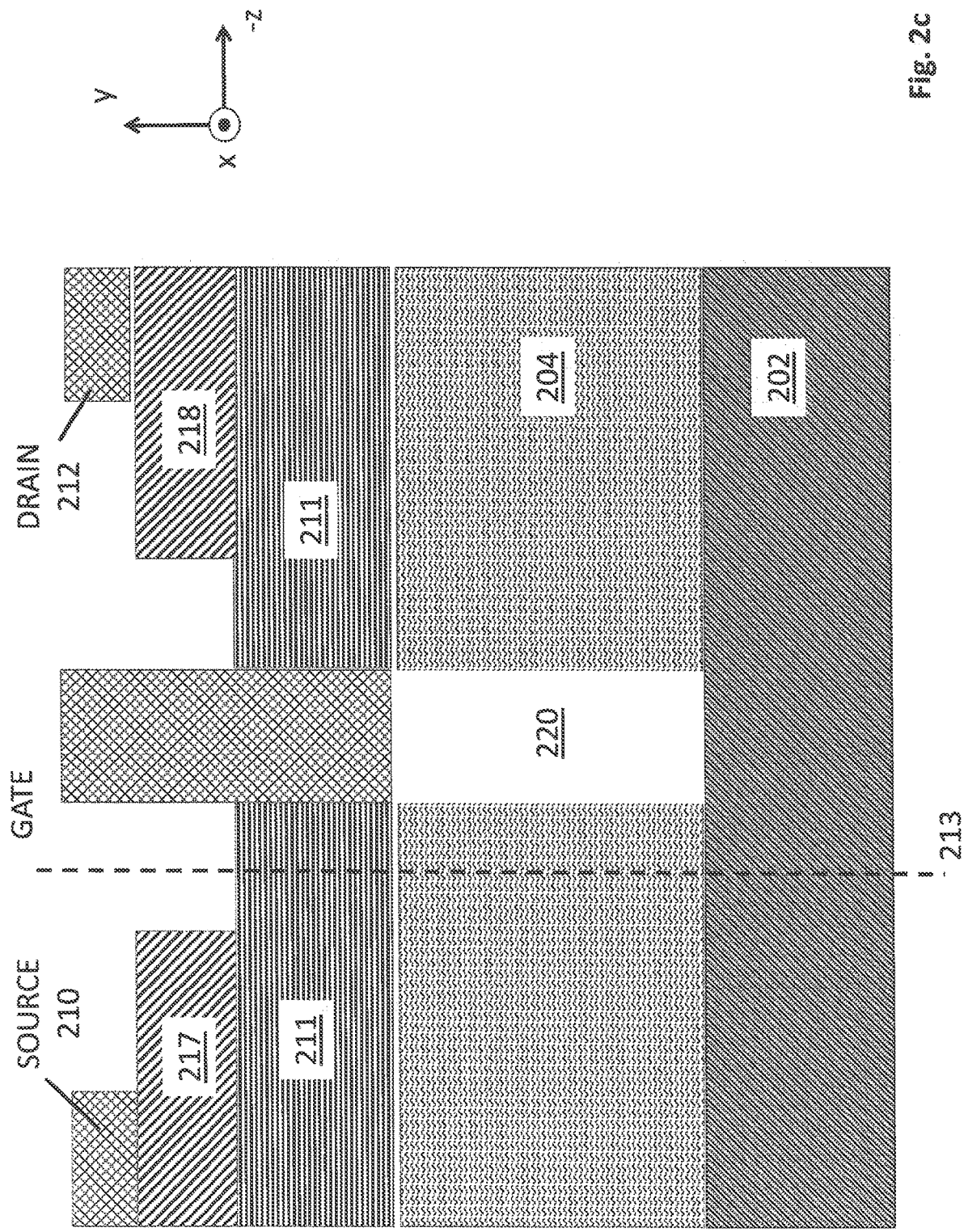

FIGS. 1a through 1c depict a high level view of aspect ratio trapping. Aspect ratio trapping is a known phenomenon in which lattice defects in an upper semiconductor material that is grown on a lower, different semiconductor material is kept proximate to the hetero-junction interface between the two materials. The defects keep local to the hetero-junction interface on account of the high aspect ratio of the upper material which is typically grown on the lower material in a tall, narrow trench that is formed in a dielectric layer that is also formed on the lower material.

FIG. 1a shows the starting point of an aspect ratio trapping structure. As discussed above, a dielectric layer 101 is formed on a lower, semiconductor material (e.g., silicon) 102. The dielectric layer 101 is of sufficient thickness such that a narrow width trench 103 that is formed in the dielectric layer 101 demonstrates high aspect ratio. That is, the height (H) of the trench 103 is substantially larger than the width (W) of the trench 103.

As observed in FIG. 1b, if a different upper semiconductor material 104 (e.g., gallium arsenide, indium phosphide, indium aluminum arsenide, etc.) begins to be epitaxially grown in the trench 103 on top of the lower semiconductor material 102, lattice defects 105 will form in the upper material 104 as a consequence of the different semiconductor materials 102, 104 having different lattice spacings. Such defects 105 will have a propensity to propagate higher into the upper semiconductor material 104 as it continues to be grown within the trench 103.

As observed in FIG. 1c, however, because the upper semiconductor material 104 is formed into a high aspect ratio structure (owing to the shape of the trench 103 in the dielectric 101 that the upper semiconductor 104 fills), the defects 105 bend toward the sidewalls of the trench 103 as they propagate upward in the second semiconductor material 104.

Hetero-junctions have traditionally been made in low aspect ratio structures (such as the upper semiconductor material completely covering the upper surface area of the lower semiconductor material) in which case the lattice defects are free to propagate directly upward and extend through the full thickness of the upper semiconductor material. Such defects essentially increase the resistivity of the upper semiconductor making it difficult to fabricate high speed devices that are designed to flow electrical current through the upper semiconductor material.

By contrast, with the aspect ratio trapping technique observed in FIG. 1c, at least some of the lattice defects 105 remain trapped in the lower region 106 of the upper semiconductor 104 where they impinge the sidewall of the upper semiconductor 104 and terminate. As a consequence, the exposed surface 107 of the upper semiconductor 104 has fewer lattice imperfections than its hetero-junction interface with the lower semiconductor 102.

FIG. 2a shows a widthwise cross section of a prior art fin field effect transistor (FINFET) transistor while FIGS. 2b and 2c shows lengthwise cross sections of the same FINFET transistor along different axis'. FIG. 2b shows a lengthwise cross section of the device that lies along a yz plane that is positioned at axis 214 of FIG. 2a. FIG. 2c shows a lengthwise cross section of the device that lies along a yz plane that is positioned at axis 215 of FIG. 2a. The cross section of FIG. 2a is taken from the perspective of xy oriented plane 213 in FIGS. 2b and 2c looking in the −z direction such that the gate is visible.

As will be made more clear in the following discussion, a comparison of both of FIGS. 2b and 2c against one another and against FIG. 2a reveals that a subfin structure 204 runs directly beneath a channel region 211 from the source to the drain whereas dielectric 201 resides on either side of the subfin structure 204 in areas that are not directly beneath the channel 211.

As is known in the art, a FINFET transistor is composed of a channel region 211 that extends up from a surface of the semiconductor chip in the form of a fin. Referring to FIG. 2c, in the active mode, electrons flow from left to right in the −z direction from the source contact 210 through the channel 211 and then into the drain contact 212. As such, current flows "into the page" of FIG. 2a within channel region 211. As observed in FIG. 2c, a void 220 exists in the subfin structure 204 directly beneath the gate to substantially prevent current flow between the source and drain within the subfin structure 204. As such, currents between source and drain substantially flow only within the channel 211. In various embodiments the void 220 may actually be filed with a dielectric such as silicon dioxide.

The channel region 211, which in various embodiments is composed of indium gallium arsenide is grown on a subfin structure 204 which in an embodiment is composed of any of gallium arsenide, indium phosphide, indium aluminum arsenide, indium arsenide, indium gallium arsenide, indium antimony or indium arsenide antimony. The subfin structure 204 is epitaxially grown on a lower semiconductor substrate 202 within a void that is etched into a dielectric layer 201. The lower substrate 202 is composed of a different material (such as silicon) than the subfin structure 204 thereby forming a hetero-structure at the subfin 204/lower substrate 202 interface. Notably, the subfin 204/lower substrate 202 interface is triangular shaped owing to etching dynamics that arise during the etching of the void in the dielectric 201 (prior to its fill by subfin 204 material) in which the lower substrate is etched at angles from its upper surface.

For perceived uniformity reasons, a traditional prior art FINFET, such as the FINFET of FIGS. 2a and 2b, strives to have a rectangular subfin 204 cross section as observed in FIG. 2a. That is, the engineering design and associated manufacturing steps used to manufacture the FINFET of FIG. 2a deliberately attempt to form the subfin structure 204 such that its sidewalls extend vertically from the surface of the lower substrate 202 forming a substantially perpendicular interface between the subfin sidewall and the lower substrate 202.

Owing to aspect ratio trapping principles, as discussed above with respect to FIGS. 1a through 1c, lattice defects formed at the bottom of the subfin structure 204 from the lattice mismatch that exists between the subfin 204 material and the lower substrate 202 material will tend to bend toward the subfin sidewalls as they propagate upward. However, as depicted in FIG. 2a, not all such defects will terminate at a sidewall which results in some defects 205 reaching the top surface interface of the subfin structure 204.

As a consequence, such defects will ultimately continue to propagate up into the channel region 211. The presence of such defects in the channel region 211 increases the resistivity of the channel 211, which, in turn, lowers the speed of the manufactured transistor.

Figure 3:
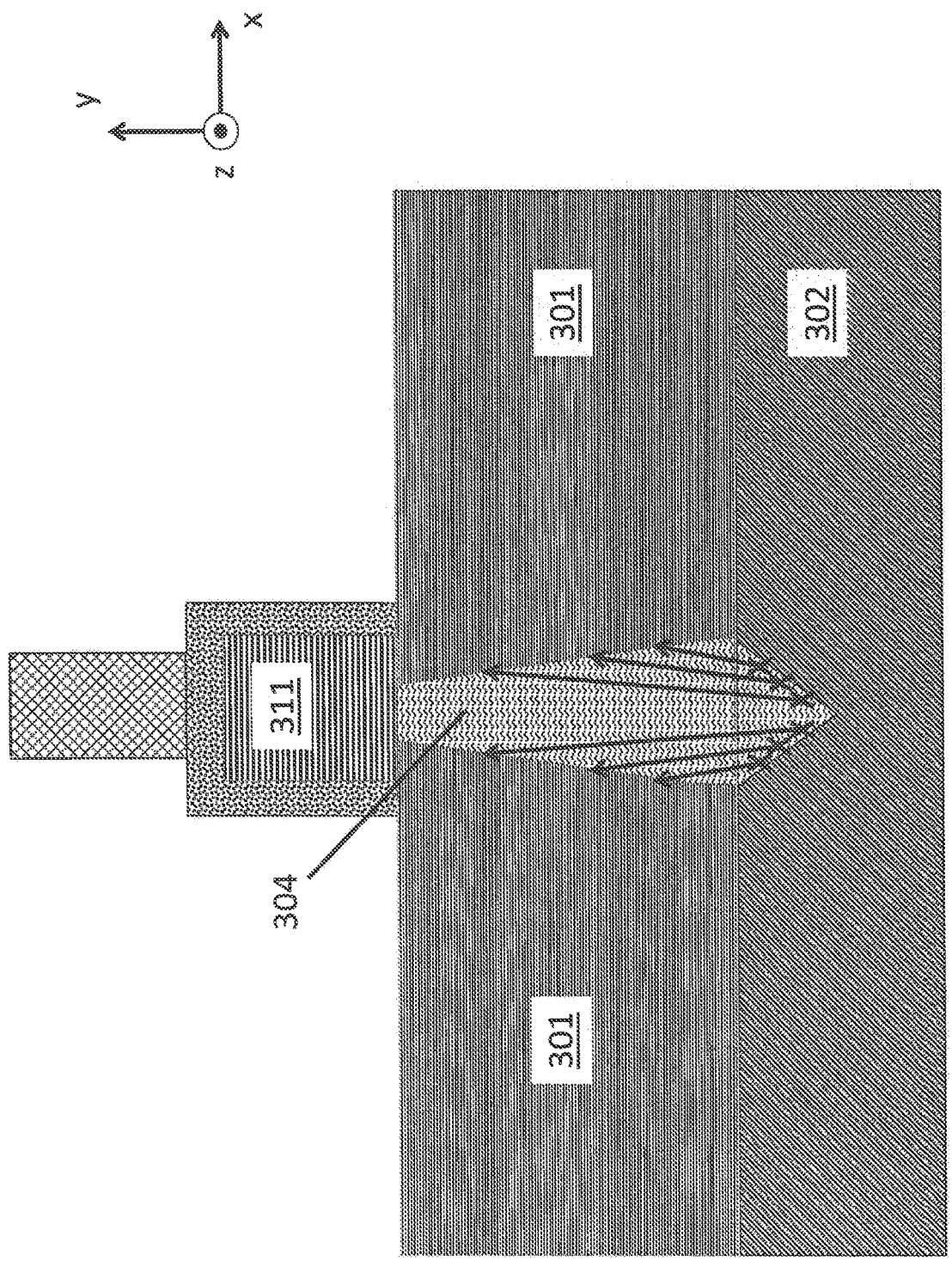
FIG. 3 shows a cross section of an improved FINFET device having a tapered subfin structure.

FIG. 3 shows the corresponding cross section for an improved device. Here, notably, the sidewalls of the subfin 304 are deliberately tapered inward. The inward tapering of the sidewalls of the subfin 304 substantially avoids creep of the dislocations from the hetero-junction to the upper surface of the subfin 304 which, in turn, dimishes the continuation of such defects into the channel 311 As such, the channel 311 in the improved device of FIG. 3 will have fewer defects than the channel 211 in the prior art device of FIG. 2a. With reduced defects propagating into the channel 311, the channel 311 of the new device in FIG. 3 will have lower resistivity than the channel 211 of the prior art device in FIG. 2a.

Comparing the cross section of the prior art device in FIG. 2a with the cross section of the device in FIG. 3, as can be seen, the length of the subfin sidewalls in FIG. 3 is longer than the length of the subfin sidewalls in FIG. 2a. The longer length sidewall, in turn, corresponds to a greater side wall surface area for a same trench/dielectric 301 height/thickness. As such, the pull or attraction of the propagation of the defects toward the subfin sidewalls is stronger with the improved device in FIG. 3 than with the prior art device of FIG. 2a. Thus, even though the vertical height of the overall device is the same as between the device in FIG. 2a and the device in FIG. 3, the device of FIG. 3 will terminate the propagation of the defects that arise from the hetero-junction deeper within the depths of the subfin 304.

Here, note that the total sidewall surface area, although enhanced with the sidewall length of a tapered subfin, is a function of not only the subfin sidewall length but also the depth of the subfin sidewall (along the z axis in FIG. 3). Thus, the total pull of the defects by the subfin sidewall is a function of the subfin sidewall length and depth.

Apart from reduced defect density at the surface of the subfin 304, as described in more detail below, the tapered subfin sidewall of FIG. 3 is actually more natural to form according to basic manufacturing processes. As such, the additional more complicated processes that have traditionally been undertaken to form the orthogonal subfin sidewalls in the prior art device of FIG. 2a can be avoided/eliminated. Thus, the improved device of FIG. 3 is not only faster than the prior art device but should also be easier/cheaper to manufacture.

Other improvements over the prior art device may also be realized in the improved device of FIG. 3. Specifically, one such disadvantage of the prior art device of FIG. 2a is the structural integrity of the subfin structure 204. That is, a tall orthogonal subfin, such as the subfin structure 204 of FIG. 2a, is inherently less stable in terms of its ability to "stand up" by itself. Said another way, it naturally tends to "fall over"—particularly as the aspect ratio of the trench increases (narrower width and taller height).

By contrast, the tapered subfin structure 304 of the improved device of FIG. 3 is a naturally more stable structure. More specifically, in terms of proportions, it has a comparatively wider base that supports a comparatively smaller load than the prior art device of FIG. 2a. As such, the subfin structure 304 of the improved device of FIG. 3 is expected to exhibit greater structural reliability than the prior art subfin structure 204 of FIG. 2a.

Another potential improvement is that leakage currents that flow from the channel 311 into the subfin structure 304 should be much less in the improved device of FIG. 3 than in the prior art device of FIG. 2a. Here, the tight narrow corners of the interface that resides between the subfin 304 and the channel 311 correspond to a much larger channel-to-subfin resistance in the improved device of FIG. 3 than the prior art device of FIG. 2a which has an inherently lower channel-to-subfin resistance owing to its coextensively planar subfin-to-channel interface.

Another potential improvement, described in more detail below, is that the subfin material 304 may be composed of the same material as the channel material 311 thereby simplifying the manufacturing process.

FIGS. 4a through 4f show an embodiment of a method for manufacturing the improved device of FIG. 3. As observed in FIG. 4a, a lower substrate of a first semiconductor material 402 (e.g., silicon) is coated with photoresist 420 which is patterned to expose openings 421 that correspond to the regions where the subfin will eventually be formed.

As observed in FIG. 4b, the lower substrate semiconductor 402 is then etched through the openings 421 to form dummy fin structure 422 and large voids 423 in the lower substrate 402. In the particular embodiment of FIG. 4b, the etch is a standard etch that naturally tapers the dummy fin 422 to approximately take the shape and form of the tapered subfin structures of FIG. 3.

Here, for instance, there is a greater concentration of etchant toward the top of openings 421 simply because the etchant resides there longer over the course of the etch. That is, with the etch starting at the top of the openings 421, by the time the etch reaches its designed for depth, the regions of the substrate material near the top of the voids 423 have been exposed to more etchant for a greater period of time than the substrate material at the bottom of the voids 423. As such, the upper region of the substrate 402 will have been etched more than the lower regions resulting in a natural tapering effect.

By contrast, as discussed at length above, in the prior art, extensive efforts are made to avoid the etch dynamics discussed immediately above so that the etching activity is approximately the same at all depths of the voids so as to create an orthogonal dummy subfin shape and not a tapered dummy subfin shape. These extensive efforts are forgone in the instant approach of FIG. 4b so as to induce a tapered shape through a standard, traditional etch.

The large voids 423 that are created from the etch are then back filled with dielectric (e.g., silicon dioxide) 401 so as to cover the dummy fin 422. As observed in FIG. 4c, the entire structure is then polished down until the tip of the dummy fin 422 is exposed.

Figure 4D:
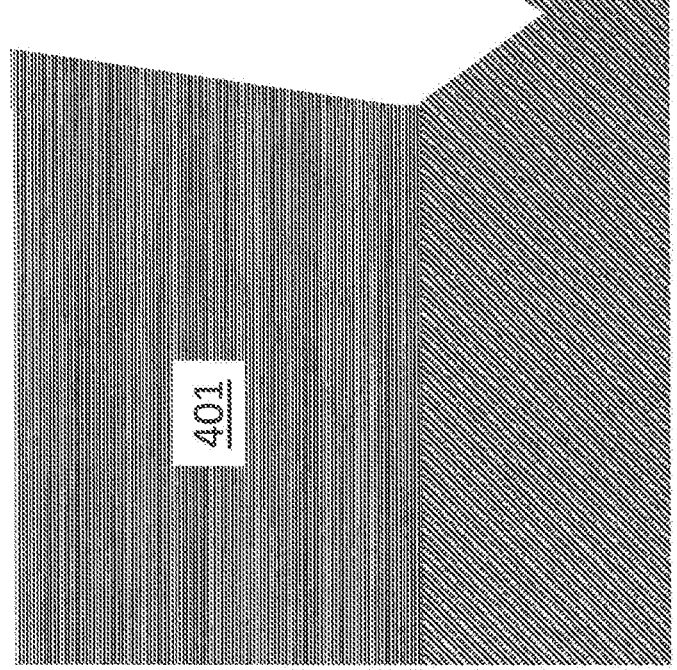

As observed in FIG. 4d, a selective etch that etches the lower substrate material 402 but not the dielectric 401 is applied to the overall structure. As such, the selective etch etches the dummy fin structure 421 but not the dielectric 401 leaving a void 424 in the dielectric material 401. In an embodiment, the chemistry of the etch causes an etch direction that angles into the lower substrate material rather than etches directly "down" into the lower substrate material which results in a spike shaped etch region in the lower substrate 402. In an embodiment, where the lower substrate is silicon having a <1,0,0> orientation and the etch is a tetramethylammonium hydroxide (TMAH) etch, the TMAH etch will etch along a <1,1,1> orientation which causes the etch to etch at angles of approximately 45° into the silicon substrate 402.

In order to enhance the shape of the void 424, that is, to increase the taper or the angle of the taper, the dielectric 401 material may be annealed after the selective etch of the lower substrate material 402. The annealing of the dielectric 401 will cause the dielectric to change its shape in a way that reduces the size of the opening at the top of the void 424, which, in turn, corresponds to a more angled taper.

Figure 4E:
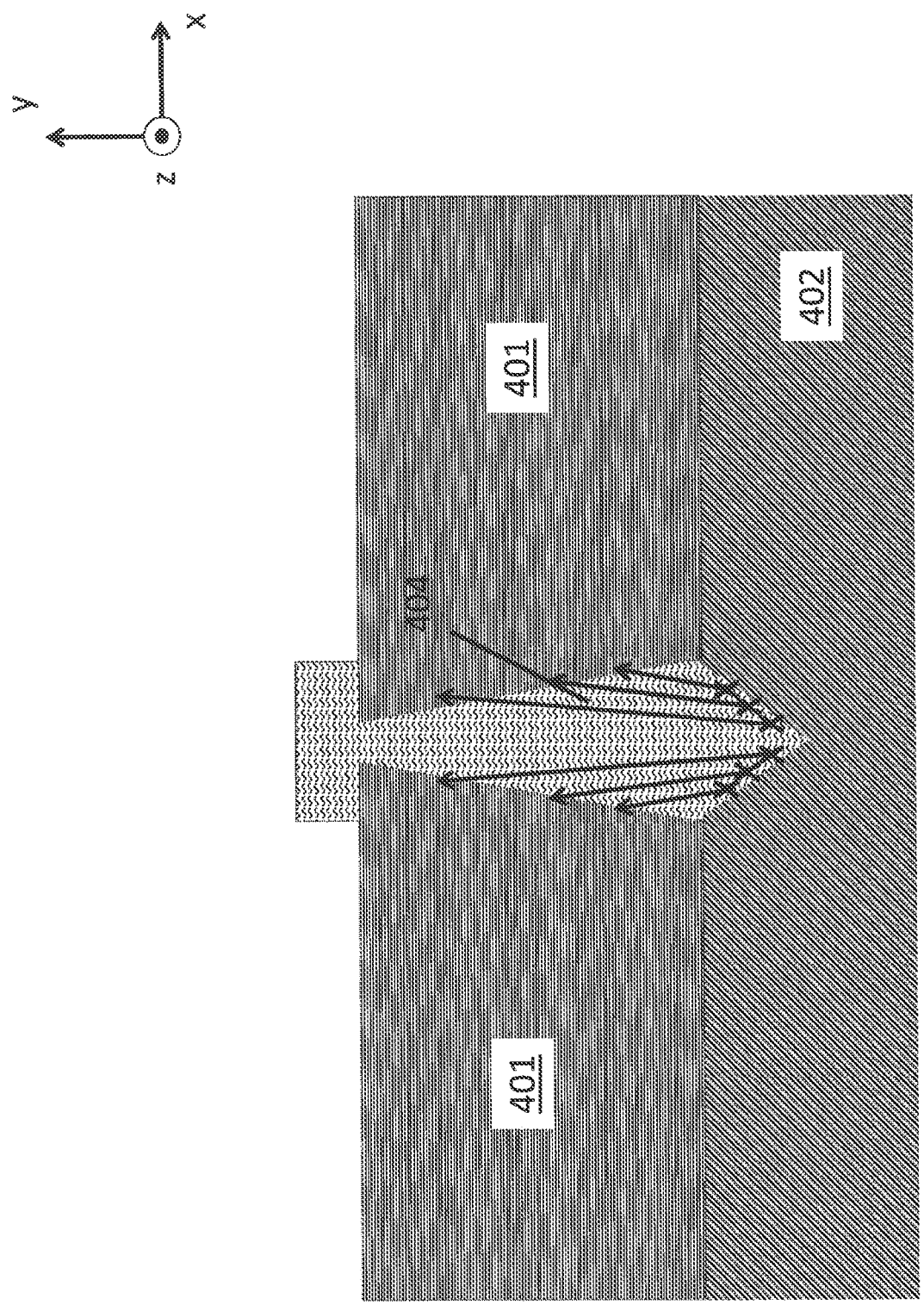

After the selective etch of FIG. 4d, as observed in FIG. 4e, a second semiconductor material 404 (e.g., gallium arsenide, indium phosphide, indium aluminum arsenide, indium arsenide, indium gallium arsenide, indium antimony, indium arsenide antimony, etc.) that is different than the lower semiconductor material 402 is epitaxially grown in the void 424 formed by the preceding etch. Owing to the tapered shape of the void 424 and the improved aspect ratio trapping that results, the upper region of the second semiconductor material 404 should be substantially free of defects that propagate from the hetero-junction interface between the second 404 and first 402 semiconductor materials. That is, such defects bend more aggressively toward the sidewalls resulting in a significant percentage of the defects terminating within the lower region of the second semiconductor material 404.

As observed in FIG. 4f, the epitaxially grown second semiconductor material 404 (and perhaps a thin upper surface of the dielectric 401) is polished down to expose a thin strip of the upper surface of the second material 404 that lies in the same plane as the upper surface of the dielectric 401.

As observed in FIG. 4g, a third semiconductor material 411 (e.g., indium gallium arsenide), e.g., composed of different material than the first and second semiconductor materials 402, 404, is epitaxially grown on the thin strip of the exposed top surface of the second semiconductor material 404. Here, the dynamics of the epitaxial growth can be specifically designed to exhibit faster vertical growth than lateral growth. Specifically, pressure and gas flow can be changed to increase vertical growth while suppressing lateral growth, which, in turn, can enable a tall fin shape without the need to confine the epitaxial growth in a trench.

FIG. 4h shows additional processing that is undertaken directly at the gate region. Here, dielectric 401 is etched back to expose the upper tip of the subfin material 404. An etch is then applied that etches away the subfin material 404. The etching of the subfin material 404 beneath the gate creates a void 420 beneath the gate (the channel 411 remains supported by the non recessed surface of dielectric 401 that exists directly beneath the channel 411 on both the source and drain sides of the gate). The void 420 may be subsequently filled with a dielectric such as silicon dioxide. For illustrative ease FIG. 4h only shows the void 420. The void/dielectric prevents "horizontal" leakage current between the source and drain within the subfin material 404.

The tapered subfin structure 404 may ease the material requirements of the channel 411 and subfin 404. In particular, comparing the prior art non tapered subfin with the tapered subfin of the instant disclosure, note that the prior art non tapered subfin has substantially more bulk and will therefore require more time to etch than the tapered subfin structure. On account of the large bulk of the prior art non tapered subfin structure, prior art processes have employed different materials for the subfin and channel to accomplish the etching of the subfin, so as to create the void, with a selective etch that only etches the lower subfin material and not the channel.

By contrast, in the case of a tapered subfin, conceivably, the lower subfin and channel may be composed of the same material because the reduced etch time associated with the etching the reduced subfin bulk will cause minimal/acceptable etching of the channel material. Here some channel thinning may occur but such thinning may even be beneficial because the gate may have even more control over the charge within the channel. As such, in FIG. 4g, material 411 may be the same material as material 404.

As observed in FIG. 4h, a high K dielectric material 413 is deposited on the exposed channel material 411. Although not observable in the particular perspective of FIG. 4h, layers of semiconductor material are deposited on either side of the channel material 411 to form raised source and drain regions. Here, comparable structures are observed as structures 217, 218 in FIG. 2b. Source, gate and drain metal nodes are then formed on the device in appropriate locations. FIG. 2b shows the placement of source 210 and drain 212 nodes. FIG. 4h shows the placement of the gate node 414.

Figure 5:
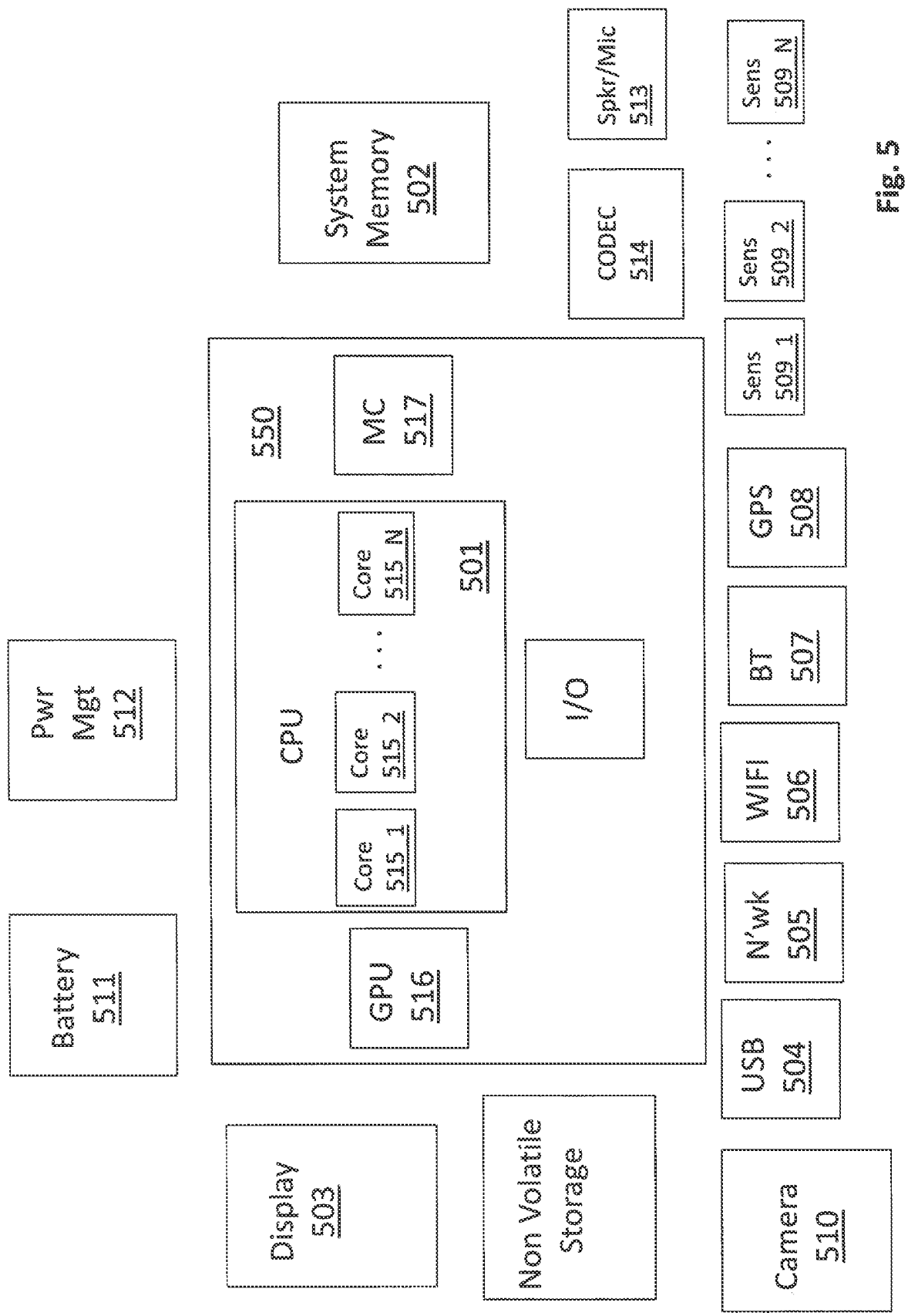
FIG. 5 shows a computing system.

FIG. 5 shows a depiction of an exemplary computing system 500 such as a personal computing system (e.g., desktop or laptop) or a mobile or handheld computing system such as a tablet device or smartphone, or, a larger computing system such as a server computing system. As observed in FIG. 5, the basic computing system may include a central processing unit 501 (which may include, e.g., a plurality of general purpose processing cores and a main memory controller disposed on an applications processor or multi-core processor), system memory 502, a display 503 (e.g., touchscreen, flat-panel), a local wired point-to-point link (e.g., USB) interface 504, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System interface 508, various sensors 509_1 through 509_N (e.g., one or more of a gyroscope, an accelerometer, a magnetometer, a temperature sensor, a pressure sensor, a humidity sensor, etc.), a camera 510, a battery 511, a power management control unit 512, a speaker and microphone 513 and an audio coder/decoder 514.

An applications processor or multi-core processor 550 may include one or more general purpose processing cores 515 within its CPU 501, one or more graphical processing units 516, a memory management function 517 (e.g., a memory controller) and an I/O control function 518. The general purpose processing cores 515 typically execute the operating system and application software of the computing system. The graphics processing units 516 typically execute graphics intensive functions to, e.g., generate graphics information that is presented on the display 503. The memory control function 517 interfaces with the system memory 502.

Each of the touchscreen display 503, the communication interfaces 504-507, the GPS interface 508, the sensors 509, the camera 510, and the speaker/microphone codec 513, 514 all can be viewed as various forms of I/O (input and/or output) relative to the overall computing system including, where appropriate, an integrated peripheral device as well (e.g., the camera 510). Depending on implementation, various ones of these I/O components may be integrated on the applications processor/multi-core processor 550 or may be located off the die or outside the package of the applications processor/multi-core processor 550.

The aforementioned transistor device may be integrated into various ones of the different computing system components described above, such as being integrated within a semiconductor chip. The specific circuitry that the device is integrated into may be logic circuitry implemented as any of an application specific integrated circuit (ASIC), a programmable logic device (PLD) circuit, or a field programmable gate array (FPGA) circuit.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

A FINFET transistor has been described. The FINFET transistor comprises a tapered subfin structure having a sidewall surface area that is large enough to induce aspect ratio trapping of lattice defects along sidewalls of the subfin structure so that the defects are substantially prevented from reaching said FINFET transistor's channel In an embodiment, the lattice defects stem from a hetero-junction interface between a lower surface of the subfin structure and a lower semiconductor substrate of the FINFET device that the subfin structure is formed on. The lower semiconductor substrate may be comprised of silicon. The subfin structure may be comprised of one of the following: gallium arsenide; indium phosphide; indium aluminum arsenide; indium arsenide; indium gallium arsenide; indium antimony; indium arsenide antimony.

In an embodiment a channel formed on the subfin structure where the channel is the same material as the subfin. The subfin structure may be comprised of one of the following: gallium arsenide; indium phosphide; indium aluminum arsenide; indium arsenide; indium gallium arsenide; indium antimony; indium arsenide antimony. In an embodiment the subfin structure is formed on a lower substrate of the FINFET device comprised of silicon.

An apparatus having the FINFET transistor is described. The apparatus may comprise a computing system. The FINFET of the computing system comprises a tapered subfin structure having a sidewall surface area that is large enough to induce aspect ratio trapping of lattice defects along sidewalls of the subfin structure so that the defects are substantially prevented from reaching said FINFET transistor's channel. In an embodiment, the lattice defects stem from a hetero-junction interface between a lower surface of the subfin structure and a lower semiconductor substrate of the FINFET device that the subfin structure is formed on. The lower semiconductor substrate may be comprised of silicon. The subfin structure may be comprised of one of the following: gallium arsenide; indium phosphide; indium aluminum arsenide; indium arsenide; indium gallium arsenide; indium antimony; indium arsenide antimony.

In an embodiment a channel formed on the subfin structure where the channel is the same material as the subfin. The subfin structure may be comprised of one of the following: gallium arsenide; indium phosphide; indium aluminum arsenide; indium arsenide; indium gallium arsenide; indium antimony; indium arsenide antimony. In an embodiment the subfin structure is formed on a lower substrate of the FINFET device comprised of silicon.

A method is described that includes epitaxially growing a substantially tapered subfin structure on a lower substrate of a FINFET device composed of a different material than the subfin structure, the substantially tapered subfin structure having a surface area that is large enough to induce aspect ratio trapping of lattice defects that arise on a bottom surface of the subfin structure so that the defects are substantially prevented from reaching the FINFET's channel.

In an embodiment the method includes, prior to the epitaxially growing of the subfin structure, etching the different material to form a dummy subfin structure where the dummy subfin structure is etched in a manner that deliberately forms a tapered dummy subfin shape rather than a substantially orthogonal dummy subfin shape.

In an embodiment the method includes, prior to the epitaxially growing of the subfin structure, annealing a dielectric having a void within which the substantially tapered subfin will be epitaxially grown, the annealing causing the void to be more tapered. The substantially tapered subfin structure may be comprised of any one of: gallium arsenide; indium phosphide; indium aluminum arsenide; indium arsenide; indium gallium arsenide; indium antimony; indium arsenide antimony. In an embodiment the method includes forming a void beneath the channel directly beneath a gate electrode region. In a further embodiment the method includes filling the void with a dielectric.

The invention claimed is:

1. An apparatus, comprising:
a FINFET transistor comprising a tapered subfin structure having a sidewall surface area that is large enough to induce aspect ratio trapping of lattice defects along sidewalls of the subfin structure so that the defects are substantially prevented from reaching said FINFET transistor's channel, the subfin structure having an upper portion, the upper portion having inwardly tapering sidewalls in a direction from a bottom of the subfin structure to a top of the subfin structure, and the upper portion laterally surrounded by a dielectric layer.

2. The apparatus of claim 1 wherein the lattice defects stem from a hetero-junction interface between a lower surface of the subfin structure and a lower semiconductor substrate of the FINFET device that the subfin structure is formed on.

3. The apparatus of claim 2 wherein the lower semiconductor substrate is comprised of silicon.

4. The apparatus of claim 3 wherein the subfin structure is comprised of one of the following:
gallium arsenide;
indium phosphide;
indium aluminum arsenide,
indium arsenide;
indium gallium arsenide;
indium antimony;
indium arsenide antimony.

5. The apparatus of claim 4 further comprising the channel formed on the subfin structure, the channel being the same material as the subfin.

6. The apparatus of claim 1 wherein the subfin structure is comprised of one of the following:
gallium arsenide;
indium phosphide;
indium aluminum arsenide,
indium arsenide;
indium gallium arsenide;
indium antimony;
indium arsenide antimony.

7. The apparatus of claim 6 wherein the subfin structure is formed on a lower substrate of the FINFET device comprised of silicon.

8. A computing system, comprising:
a plurality of processing cores;
a system memory;
a memory controller coupled between the plurality of processing cores and the system memory;
a networking interface;
a semiconductor chip comprising a FINFET transistor, the FINFET transistor comprising a tapered subfin structure having a sidewall surface area that is large enough to induce aspect ratio trapping of lattice defects along sidewalls of the subfin structure so that the defects are substantially prevented from reaching said FINFET transistor's channel, the subfin structure having an upper portion, the upper portion having inwardly tapering sidewalls in a direction from a bottom of the subfin structure to a top of the subfin structure, and the upper portion laterally surrounded by a dielectric layer.

9. The computing system of claim 8 wherein the lattice defects stem from a hetero-junction interface between a lower surface of the subfin structure and a lower semiconductor substrate of the FINFET device that the subfin structure is formed on.

10. The computing system of claim 9 wherein the lower semiconductor substrate is comprised of silicon.

11. The computing system of claim 10 wherein the subfin structure is comprised of one of the following:
gallium arsenide;
indium phosphide;
indium aluminum arsenide,
indium arsenide;
indium gallium arsenide;
indium antimony;
indium arsenide antimony.

12. The computing system of claim 11 further comprising a channel formed on the subfin structure being the same material as the subfin.

13. The computing system of claim 8 wherein the subfin structure is comprised of one of the following:
gallium arsenide;
indium phosphide;
indium aluminum arsenide,
indium arsenide;
indium gallium arsenide;
indium antimony;
indium arsenide antimony.

14. The computing system of claim 13 wherein the subfin structure is formed on a lower substrate of the FINFET device comprised of silicon.

15. A method, comprising:
epitaxially growing a substantially tapered subfin structure on a lower substrate of a FINFET device composed of a different material than the subfin structure, the substantially tapered subfin structure having a surface area that is large enough to induce aspect ratio trapping of lattice defects that arise on a bottom surface of the subfin structure so that said defects are substantially prevented from reaching the FINFET device's channel, the subfin structure having an upper portion, the upper portion having inwardly tapering sidewalls in a direction from a bottom of the subfin structure to a top of the subfin structure, and the upper portion laterally surrounded by a dielectric layer.

16. The method of claim 15 further comprising, prior to the epitaxially growing of the subfin structure, etching the different material to form a dummy subfin structure, the dummy subfin structure being etched in a manner that deliberately forms a tapered dummy subfin shape rather than a substantially orthogonal dummy subfin shape.

17. The method of claim 15 further comprising, prior to the epitaxially growing of the subfin structure, annealing a dielectric having a void within which the substantially tapered subfin will be epitaxially grown, the annealing causing the void to be more tapered.

18. The method of claim 15 wherein the substantially tapered subfin structure comprises any one of:
gallium arsenide;
indium phosphide;
indium aluminum arsenide,
indium arsenide;
indium gallium arsenide;
indium antimony;
indium arsenide antimony.

19. The method of claim 15 wherein further comprising forming a void beneath the channel directly beneath a gate electrode region.

20. The method of claim 19 further comprising filling the void with a dielectric.

21. A method, comprising:
epitaxially growing a substantially tapered subfin structure on a lower substrate of a FINFET device composed of a different material than the subfin structure, the substantially tapered subfin structure having a surface area that is large enough to induce aspect ratio trapping of lattice defects that arise on a bottom surface of the subfin structure so that said defects are substantially prevented from reaching the FINFET device's channel; and
prior to the epitaxially growing of the subfin structure, annealing a dielectric having a void within which the substantially tapered subfin will be epitaxially grown, the annealing causing the void to be more tapered.

22. A method, comprising:
epitaxially growing a substantially tapered subfin structure on a lower substrate of a FINFET device composed of a different material than the subfin structure, the substantially tapered subfin structure having a surface area that is large enough to induce aspect ratio trapping of lattice defects that arise on a bottom surface of the subfin structure so that said defects are substantially prevented from reaching the FINFET device's channel; and forming a void beneath the channel directly beneath a gate electrode region.

23. The method of claim 22 further comprising filling the void with a dielectric.

* * * * *